(12) United States Patent
Suda

(10) Patent No.: US 6,324,197 B1
(45) Date of Patent: Nov. 27, 2001

(54) POWER CONTROLLER FOR SEMICONDUCTOR LASER DEVICE

(75) Inventor: Tadaaki Suda, Saitama (JP)

(73) Assignee: Asahi Kogaku Kogyo Kabushiki Kaisha, Tokyo (JP)

(*) Notice: Subject to any disclaimer, the term of this patent is extended or adjusted under 35 U.S.C. 154(b) by 0 days.

(21) Appl. No.: 09/482,651

(22) Filed: Jan. 13, 2000

(30) Foreign Application Priority Data

Jan. 14, 1999 (JP) .................................................. 11-007673

(51) Int. Cl.[7] .......................................................... H01S 3/00
(52) U.S. Cl. ........................................ 372/38.01; 372/38.1
(58) Field of Search .............................. 372/38.1, 38.01, 372/38.02, 38.07, 29.01, 29.011, 29.014, 29.015, 29.02, 29.021, 43; 359/187

(56) References Cited

U.S. PATENT DOCUMENTS 5,073,838 * 12/1991 Ames ................................... 372/38.1
5,166,509 * 11/1992 Curran .................................. 359/187
5,859,659 1/1999 Araki et al. ........................... 347/246

* cited by examiner

*Primary Examiner*—Quyen Leung
(74) *Attorney, Agent, or Firm*—Greenblum & Bernstein, P.L.C.

(57) ABSTRACT

A power controller controls a power of a laser emitted from a semiconductor laser device which includes a laser diode and an internal photodiode integrally assembled in a small substrate. The laser diode is electrically energized by an electric current power source, and the laser power is detected as a first electric current signal by the internal photodiode. An external photodiode detects the laser power as a second electric current signal. A feedback controller controls the power source on the basis of one of the first and second electric current signals. The controlling of the power source by the feedback controller is based on the second electric current signal when the operation of the external photodiode is proper and normal. The controlling of the power source by the feedback controller is based on the first electric current signal when the operation of the external photodiode is improper and abnormal.

11 Claims, 10 Drawing Sheets

POWER CONTROLLER FOR SEMICONDUCTOR LASER DEVICE

BACKGROUND OF THE INVENTION

1. Field of the Invention

The present invention relates to a power controller for a semiconductor laser device which is incorporated in a laser beam scanner used in, for example, a laser printer.

2. Description of the Related Art

In general, a semiconductor laser device is available as an integrated-circuit package or chip on the market, and includes a laser diode and an internal photodiode, which are integrally assembled in a small substrate. As is well known, the laser diode produces and emits two lasers from the opposite end faces thereof. Only one of the two lasers, i.e. a so-called front laser, is utilized as a scanning laser beam, and the other laser, i.e. a so-called back laser, is utilized to control a power of the front laser in a feedback manner.

Powers of the two lasers, emitted from the laser diode, are unstable because they are especially influenced by a variation in a temperature of the laser diode per se. In order to make the power of the front laser, and therefore, the power of the scanning laser beam, stable, the semiconductor laser device is associated with a feedback control circuit, a so-called auto-power control (APC) circuit, and an electric current power source for electrically energizing the laser diode is controlled by the APC circuit.

In particular, a power of the back laser is detected by the internal photodiode integrally assembled in the small substrate of the semiconductor laser device, and the internal photodiode produces an electric current in accordance with the detected power of the back laser. The produced electric current is outputted to the APC circuit, and is then converted into a voltage representing the detected power of the back laser. The APC circuit compares the converted voltage with a reference voltage, and controls an output current of the electric current power source for electrically energizing the laser diode such that a differential voltage between the converted voltage and the reference voltage becomes zero, thereby making the power of the scanning laser beam stable.

Nevertheless, the internal photodiode, integrally assembled in the small substrate of the semiconductor laser device, is inferior in ability of response. Therefore, for example, when the semiconductor laser device is incorporated in a laser beam scanner used in a laser printer, a printing speed of the laser printer cannot be increased greater than the ability of response of the internal photodiode.

It has been proposed that an external photodiode, such as a PIN-type photodiode, which is superior in ability of response to the internal photodiode, be associated with the semiconductor laser device, thereby further increasing the printing speed of the laser printer. In particular, the front laser, emitted from the laser diode, is optically shaped and converted into a laser beam, which is then split into two laser beams by, for example, a beam splitter. One of the split laser beams is utilized as a scanning laser beam, and a power of the other split laser beam is detected by the external photodiode to control an output current of the electric current power source for electrically energizing the laser diode in the same manner as mentioned above.

In addition to the superior ability of response, the APC control system using the external photodiode exhibits another merit that the power of the laser beam, detected by the external photodiode, directly represents the power of the scanning laser beam, whereby the output current of the electric current power source for the laser diode can be more properly controlled in comparison with the internal photodiode of the semiconductor laser device.

Nevertheless, the APC control system using the external photodiode involves a serious risk that the laser diode may be easily damaged when the output current of the external photodiode is accidently reduced. In particular, for example, during inspection and maintenance of the laser printer, from which a cover or housing is removed, the laser beam to be detected by the external photodiode may be accidently blocked off by a tool, such as a screw driver, foreign matter or the like. Of course, when the blockage of the laser beam to be detected takes place, the output current of the electric current power source for the laser diode is abruptly and excessively increased due to the feedback control of the APC control circuit, so that the laser diode is electrically energized with the excessively-increased current, resulting in damage to the laser diode.

SUMMARY OF THE INVENTION

Therefore, an object of the present invention is to provide a power controller for a semiconductor laser device of the aforementioned type, associated with an external photodiode for controlling an output current of an electric current power source for electrically energizing a laser diode of the semiconductor laser device, the power controller being constituted such that the laser diode of the semiconductor laser device cannot be damaged even if a laser beam to be detected by the external photodiode is blocked off.

In accordance with an aspect of the present invention, there is provided a power controller for a semiconductor laser device including a laser diode and an internal photodiode integrally assembled in a small substrate, which comprises: an electric current power source that electrically energizes the laser diode, an output power of the laser diode being detected as a first electric current detection signal by the internal photodiode; an external photodiode that detects an output power of the laser diode as a second electric current detection signal; a feedback controller that controls the electric current power source on the basis of one of the first and second electric current detection signals; a determiner that determines whether an operation of the external photodiode is proper and normal. The controlling of the electric current power source by the feedback controller is based on the second electric current detection signal when it is determined by the determiner that the operation of the external photodiode is proper and normal, and the controlling of the electric current power source by the feedback controller is based on the first electric current detection signal when it is determined by the determiner that the operation of the external photodiode is improper and abnormal.

In accordance with another aspect of the present invention, there is provided a power controller for a semiconductor laser device including a laser diode and an internal photodiode integrally assembled in a small substrate, which comprises: an electric current power source that electrically energizes the laser diode, a output power of the laser diode being detected as a first electric current detection signal by the internal photodiode; an external photodiode that detects an output power of the laser diode as a second electric current detection signal; a feedback controller that controls the electric current power source on the basis of one of the first and second electric current detection signals; a first determiner that determines whether an operation of the internal photodiode is proper and normal; and a second determiner that determines whether an operation of the external photodiode is proper and normal. The controlling of the electric current power source by the feedback controller is based on the second electric current detection signal when it is determined by the second determiner that the operation of the external photodiode is proper and normal, and the controlling of the electric current power source by the feedback controller is based on the first electric current detection signal when it is determined by the second determiner that the operation of the external photodiode is improper and abnormal and when it is determined by the first determiner that the operation of the internal photodiode is proper and normal.

Preferably, the determination of the first determiner is based on a comparison of the first electric current detection signal, obtained from the internal photodiode, with the second electric current detection signal obtained from the external photodiode, and the determination of the second determiner is based on a comparison of the second electric current detection signal, obtained from the external photodiode, with the first electric current detection signal obtained from the internal photodiode.

Preferably, the power controller further comprises: a first current-to-voltage converter that converts the first electric current detection signal into a first electric voltage signal; a second current-to-voltage converter that converts the second electric current detection signal into a second electric voltage signal; a switcher that selectively feeds one of the first and second electric voltage signals to the feedback controller for the controlling of the electric current power source by the feedback controller; and a switching controller that controls the switcher such that the second electric voltage signal is fed to the feedback controller when it is determined by the second determiner that the operation of the external photodiode is proper and normal, and such that the first electric voltage signal is fed to the feedback controller when it is determined by the second determiner that the operation of the external photodiode is improper and abnormal.

Optionally, the first determiner may include a first signal processor that processes the first electric voltage signal to produce a first derivative voltage signal representing the first electric current detection signal, and the second determiner may include a second signal processor that processes the second electric voltage signal to produce a second derivative voltage signal representing the second electric current detection signal. In this case, the determination of the first determiner is based on a comparison of the first electric voltage signal with the second derivative voltage signal, and the determination of the second determiner is based on a comparison of the second derivative voltage signal with the first derivative voltage signal.

The first signal processor may include a first current-to-voltage converter that converts the first electric current detection signal into the first electric voltage signal, and a first electric variable resistance that produces the first derivative voltage signal derived and divided from the first electric voltage signal. Similarly, the second signal processor may include a second current-to-voltage converter that converts the second electric current detection signal into the second electric voltage signal, and a second electric variable resistance that produces the second derivative voltage signal derived and divided from the second electric voltage signal. In this case, the first signal processor further includes a first comparator that compares the first voltage signal with the second derivative voltage signal, and the second signal processor further includes a second comparator that compares the second derivative voltage signal with the first derivative voltage signal.

Optionally, the first determiner may include a first analog-to-digital converter that converts the first electric current detection signal into a first digital voltage signal, and a first adder that adds a first margin voltage data to the first digital voltage signal to produce a first resultant digital voltage signal. Similarly, the second determiner may include a second analog-to-digital converter that converts the second electric current detection signal into a second digital voltage signal, and a second adder that adds a second margin voltage data to the second digital voltage signal to produce a second resultant digital voltage signal. In this case, the first determiner includes a first comparator that compares the first resultant digital voltage signal with the second digital voltage signal, and the second determiner further includes a second comparator that compares the second resultant digital voltage signal with the first digital voltage detection signal.

The power controller may further comprise a first indicator that indicates whether the operation of the internal photodiode is proper and normal, and a second indicator that indicates whether the operation of the external photodiode is proper and normal. Preferably, each of the first and second indicators comprises a visual indicator such as a light emitting diode.

In accordance with a further aspect of the present invention, there is provided a laser printer having the above-mentioned power controller. The laser printer comprises a laser beam scanner that deflects a laser beam, obtained by the laser diode, to produce a scanning laser beam, and a modulator that modulates a power of the scanning laser beam by controlling the power controller in accordance with gradation data representing a digital image-pixel signal. The modulation of the power of the scanning laser beam is performed in a low-speed mode when the controlling of the electric current power source by the feedback controller is based on the first electric current detection signal, and the modulation of the power of the scanning laser beam is performed in a high-speed mode when the controlling of the electric current power source by the feedback controller is based on the second electric current detection signal.

BRIEF DESCRIPTION OF THE DRAWINGS

The object and other objects of the present invention will be better understood from the following description, with reference to the accompanying drawings in which.

DESCRIPTION OF THE PREFERRED EMBODIMENTS

Figure 1:
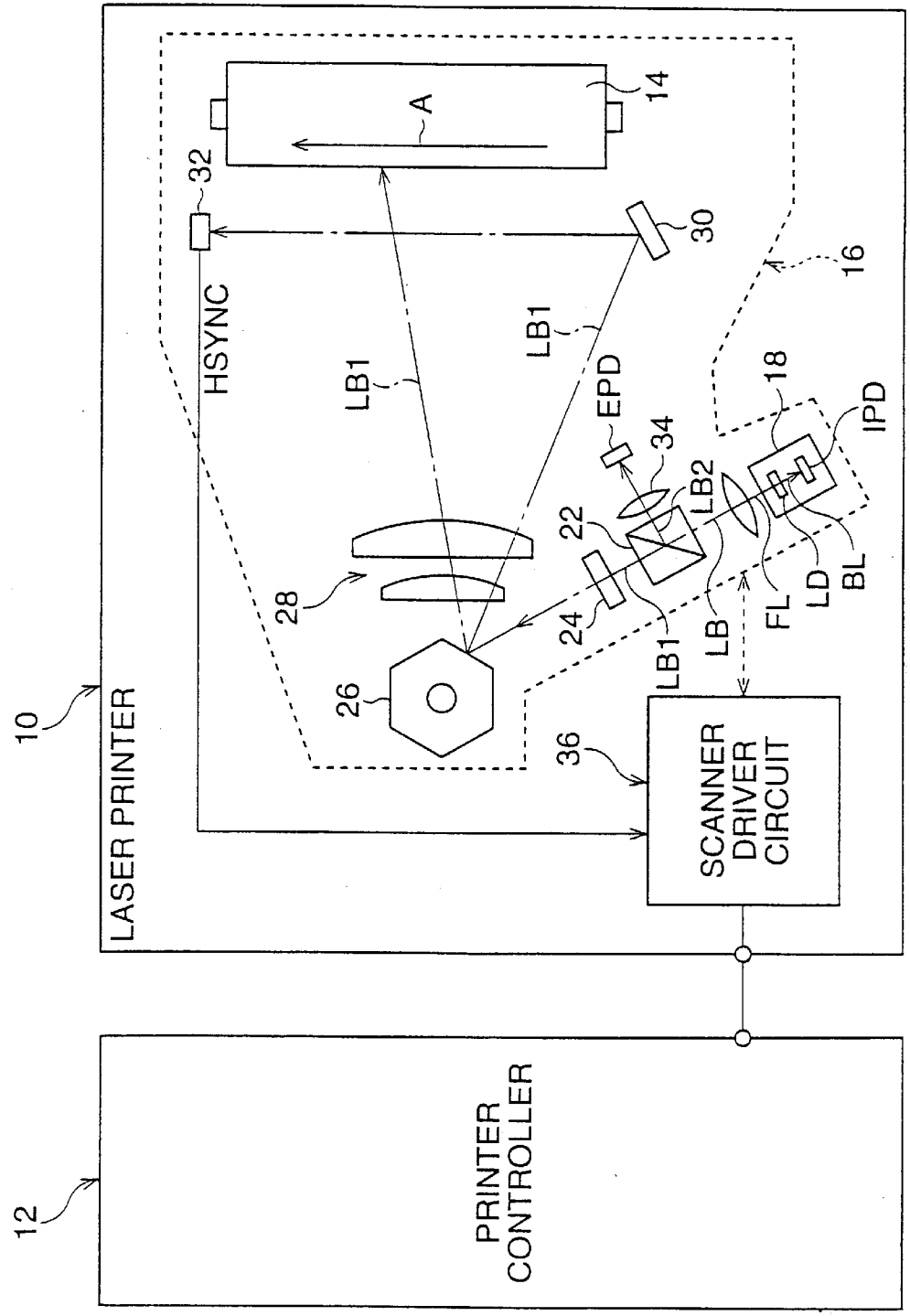
FIG. 1 is a schematic block diagram showing a laser printer with a printer controller, in which an embodiment of a power controller for a semiconductor laser device according to the present invention is incorporated.

FIG. 1 schematically shows a laser printer 10, in which a semiconductor laser power controller according to the present invention is embodied. The laser printer 10 is provided with a printer controller 12, which comprises a microcomputer, to control a printing operation executed in the laser printer 10. The laser printer 10 is also provided with a photosensitive drum 14 having a photoconductive layer formed therearound, and a laser scanner unit 16 for writing an electrostatic latent image on the photoconductive layer of the drum 14 which is electrostatically charged.

The laser scanner unit 16 includes a semiconductor laser device 18 which is available as an integrated-circuit package or chip on the market. The semiconductor laser device 18 has a laser diode LD and an internal photodiode IPD integrally assembled in a small substrate of the semiconductor laser device 18. The laser diode LD produces and emits two lasers, i.e. a front laser FL and a back laser BL, from the opposite end faces thereof. The front laser FL is outputted outside from the semiconductor laser device 18, and a power of the back laser BL is detected by the internal photodiode IPD to perform a power control of the front laser FL in a manner as mentioned in detail hereinafter.

The laser scanner unit 16 also includes a collimator lens 20, which is associated with the semiconductor laser device 18 such that the front laser FL is converted into a laser beam LB. The collimator lens 20 is then associated with the beam splitter 22, by which the laser beam LB is split into a first laser beam LB1 and a second laser beam LB2, as shown in FIG. 1.

The first laser beam LB1 is shaped by a cylindrical lens 24 such that a cross-sectional shape thereof is converted from an oval into a circle, and then the shaped laser beam LB1 is made incident on a rotating polygon mirror 26. The laser beam LB1 is reflected by the rotating polygon mirror 26 so as to be directed to the drum 14 through an fθ lens 28. Namely, the laser beam LB1 is deflected by each of the reflective surfaces of the polygon mirror 26 such that the electrostatically-charged photoconductive layer formed around the drum 14 is scanned with the deflected laser beam LB1 in a direction indicated by an arrow A.

In this embodiment, during a printing operation of the laser printer 10, the scanning laser beam LB1 is modulated in accordance with a series of digital image-pixel signals, each of which is represented by, for example, 10-bit gradation data. Namely, the modulation of the scanning laser beam LB1 is performed such that a power of the scanning laser beam LB1 is discretely varied within a power range which is defined by 1024 power levels defined by the 10-bit gradation data. On the other hand, during the printing operation, the drum 14 is rotated at a predetermined peripheral speed, and thus a two-dimensional dotted-image is written and formed as an electrostatic latent image on the electrostatically-charged photoconductive layer of the drum 14 by the modulated scanning laser beam LB1.

Of course, as is well known, the dotted latent image is developed with an electrostatically-charged developer, i.e. toner, and each of the dots, forming the developed toner image, exhibits a density which is defined by one of the 1024 gradation-levels corresponding to the 1024 power levels of the scanning laser beam LB1, respectively. Then, the developed toner image is electrostatically transferred to a recording medium, such as a sheet of paper, and the transferred toner image is thermally fused and fixed on the recording medium by a heat roller (not shown).

In order to perform the modulation of the scanning laser beam LB1 at a proper timing in accordance with each digital image-pixel signal, the laser scanner unit 16 is provided with a mirror 30 for detecting the scanning laser beam LB1, and a photo detector 32 associated with the mirror 30. When the scanning laser beam LB1 is made incident on the mirror 30 at a given location thereon, the incident laser beam LB1 is reflected toward the photo detector 32. When the reflected laser beam LB1 is received by the photo detector 32, a pulse signal or horizontal synchronizing signal HSYNC is produced by and outputted from the photo detector 32. In short, it is possible to timely perform the modulation of the scanning laser beam LB1 in accordance with every signal-line of digital image-pixel signals by detecting an outputting of the horizontal synchronizing signal HSYNC. Note, the photo detector 32 may be formed as a suitable photodiode.

The modulation of the scanning laser beam LB1 and the power control of the scanning laser beam LB1 are executed by a scanner driver circuit 36, which is operated under control of the printer controller 12, as stated in detail hereinafter.

On the other hand, the second laser beam LB2 is made incident on an external photodiode EPD through a condenser lens 34. Namely, a power of the second laser beam LB2, which represents the power of the first laser beam LB1, is detected by the external photodiode EPD, thereby controlling the power of the front laser FL, and therefore, the first laser beam LB1, in a manner as mentioned in detail hereinafter. In this embodiment, as the external photodiode EPD, for example, a PIN-type photodiode is used, which is superior in ability of response to the internal photodiode IPD integrally assembled in the small substrate of the semiconductor laser device 18.

Figure 2:
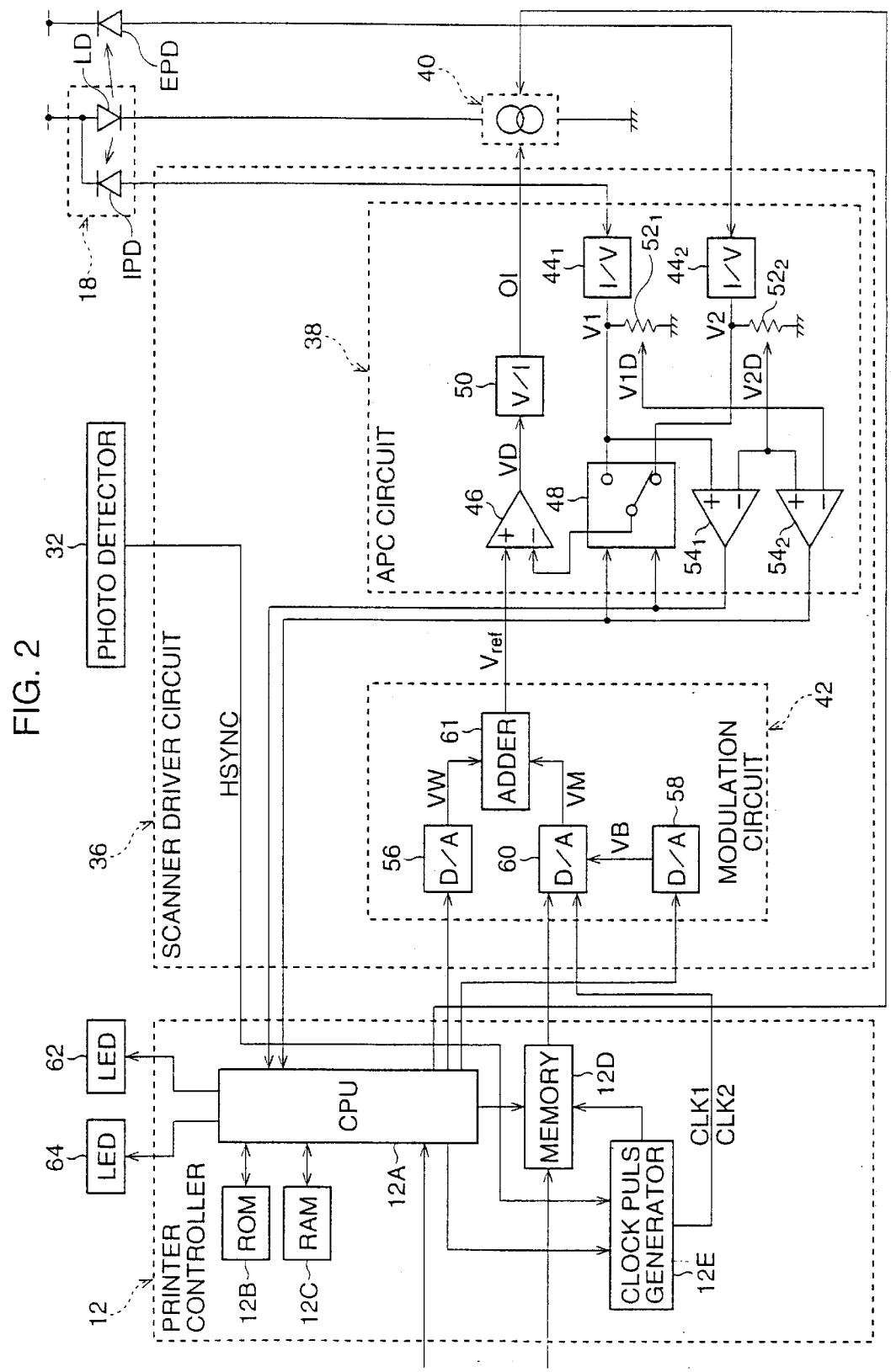
FIG. 2 is a schematic block diagram of the printer controller and a scanner driver circuit of the laser printer.

As shown in FIG. 2, the printer controller 12 includes a central processing unit (CPU) 12A, a read-only memory (ROM) 12B for storing programs and constants, and a random-access memory (RAM) 12C for storing temporary data, which form the above-mentioned microcomputer.

The printer controller 12 also includes a frame memory 12D for temporarily storing a frame of digital image-pixel signals, which is successively fed from, for example, a word processor, a personal computer or the like connected to the laser printer 10. Note, usually, each of the digital image-pixel signals, obtained from the word processor, the personal computer or the like, is represented by 10-bit gradation data (gradations of 1024 levels).

The printer controller 12 further includes a clock pulse generator 12E for selectively generating and outputting a first series of clock pulses CLK1 and a second series of clock pulses CLK2, which are selectively and successively utilized to read a single-line of digital image-pixel signals from the frame memory 12D in accordance with every outputting of the horizontal synchronizing signal HSYNC from the photo detector 32. Namely, the reading of the digital image-pixel signals from the frame memory 12D is performed in accordance with either the first series of clock pulses CLK1 or the second series of clock pulses CLK2. Note, a frequency of the second series of clock pulses CLK2 is higher than that of the first series of clock pulses CLK1.

As shown in FIG. 2, the scanner driver circuit 36 includes an auto-power control (APC) circuit 38 for properly controlling an output current of an electric current power source circuit 40 for electrically energizing the laser diode LD, and a modulation circuit 42 for producing a reference voltage $V_{ref}$ on the basis of each digital image-pixel signal. The reference voltage $V_{ref}$ is outputted from the modulation circuit 42 to the APC circuit 38, thereby performing the power control of the scanning laser beam LB1 on the basis of the reference voltage $V_{ref}$, resulting in the modulation of the scanning laser beam LB1 in accordance with each digital image-pixel signal.

The APC circuit 38 includes a first current-to-voltage (I/V) converter $44_1$ for converting an output current of the internal photodiode IPD into a voltage V1, and a second current-to-voltage (I/V) converter $44_2$ for converting an output current of the external photodiode EPD into a voltage V2. Each of the output currents of the internal and external photodiodes IPD and EPD changes in accordance with a variation in the power of the scanning laser beam LB1, and thus each of the voltages V1 and V2 represents the power of the scanning laser beam LB1.

As is apparent from FIG. 2, the voltages V1 and V2 are selectively inputted to a negative input terminal of a difference amplifier 46 through a switching circuit 48. As long as the external photodiode EPD is properly and normally operated, an output terminal of the switching circuit 48 is connected to an output terminal of the second I/V converter $44_2$, as shown in FIG. 2, such that the voltage V2 is inputted to the negative input terminal of the difference amplifier 46. When the operation of the external photodiode EPD is improper and abnormal, the connection of the output terminal of the switching circuit 48 to the output terminal of the second I/V converter $44_2$ is switched to an output terminal of the first I/V converter $44_1$, such that the voltage V1 is inputted to the negative input terminal of the difference amplifier 46.

As is apparent from FIG. 2, the reference voltage $V_{ref}$, produced in and outputted from the modulation circuit 42, is inputted to a positive input terminal of the difference amplifier 46, in which the voltage (V1 or V2) is compared with the reference voltage $V_{ref}$, thereby producing a differential voltage VD therebetween. The difference amplifier 46 outputs the differential voltage VD from an output terminal thereof to a voltage-to-current (V/I) converter 50, in which the differential voltage VD is converted into an electric current.

Then, the converted electric current is fed as an output current OI to the electric current power source circuit 40 for electrically energizing the laser diode LD. The output current OI is fluctuated in accordance with whether the differential voltage VD is positive or negative, and a degree of the fluctuation of the output current OI depends on a magnitude of the differential voltage VD.

In particular, if $V_{ref}$>V1 or V2, the differential voltage VD is inputted as a positive voltage to the V/I converter 50, so that the output current OI is increased, and that a degree of the increase of the output current OI depends on a magnitude of the differential voltage VD. On the other hand, if $V_{ref}$<V1 or V2, the differential voltage VD is inputted as a negative voltage to the V/I converter 50, so that the output current OI is decreased, and that a degree of the decrease of the output current OI depends on a magnitude of the differential voltage VD.

The larger the output current OI of the V/I converter 50, the larger the output current of the electric current power source circuit 40, resulting in the increase of the power of the scanning laser beam LB1 to be emitted from the semiconductor laser device 18. Conversely, the smaller the output current OI of the V/I converter 50, the smaller the output current of the electric current power source circuit 40, resulting in the decrease of the power of the scanning laser beam LB1 to be outputted from the semiconductor laser device 18.

In short, the I/V converter ($44_1$ or $44_2$), the difference amplifier 46, and the V/I converter 50 form a feedback control circuit for controlling the output current of the electric current power source circuit 40 such that the power of the scanning laser beam LB1 corresponds to the reference voltage $V_{ref}$, produced in and outputted from the modulation circuit 42.

In order to detect whether each of the internal and external photodiodes IPD and EPD is properly and normally operated, the APC circuit 38 is provided with a set of first and second variable resistances $52_1$ and $52_2$, and a set of first and second comparators $54_1$ and $54_2$, which are arranged as shown in FIG. 2. The first variable resistance $52_1$ is previously adjusted and set so as to produce a divided voltage V1D, which is derived and divided from the output voltage V1 of the first I/V converter $44_1$, and the divided voltage V1D is of course lower than the output voltage V1 of the first I/V converter $44_1$. Also, the second variable resistance $52_2$ is previously adjusted and set so as to produce a divided voltage V2D, which is derived and divided from the output voltage V2 of the second I/V converter $44_2$, and which higher than the divided voltage V1D.

Note, of course, in this embodiment, a suitable margin voltage is previously selected and set as a differential voltage between the divided voltages V1 and V2D, and a suitable margin voltage is previously selected and set as a differential voltage between the voltages V2D and V1D.

Thus, as long as the internal and external photodiodes IPD and EPD are properly and normally operated, the following relationship is established between the output voltage V1 and the divided voltages V1D and V2D:

V1>V2D>V1D

As is apparent from the FIG. 2, the output voltage V1 of the first I/V converter $44_1$ and the divided voltage V2D are respectively inputted to positive and negative input terminals of the first comparator $54_1$. When both the internal and external photodiodes IPD and EPD are properly and normally operated, i.e. when the output voltage V1 of the first I/V converter $44_1$ is higher than the divided voltage V2D, an output signal of the first comparator $54_1$ is maintained at a high level. However, when the internal photodiode IPD breaks down, the output voltage V1 of the first I/V converter $44_1$, representing the output current of the internal photodiode IPD, is considerably lowered, so that the output voltage V1 drops over the margin voltage (V1<V2D). At this time, the output signal of the first comparator $54_1$ is changed from the high level to a low level.

Also, as shown in FIG. 2, the divided voltages V2D and V1D are respectively inputted to positive and negative input terminals of the second comparator $54_2$. When both the internal and external photodiodes IPD and EPD are properly and normally operated, i.e. when the divided voltage V2D is higher than the divided voltage V1D, an output signal of the second comparator $54_2$ is maintained at a high level. However, when the external photodiode EPD breaks down or when the second laser beam LB2 is blocked off by foreign matter, such as dust, intervening between, for example, the condenser lens 34 and the external photodiode EPD, the output voltage V2 of the second I/V converter $44_2$, representing the output current of the external photodiode EPD, is considerably lowered so that the divided voltage V2D drops over the margin voltage (V2D<V1D). At this time, the output signal of the second comparator $54_2$ is changed from the high level to a low level.

In this embodiment, an switching operation of the switching circuit 48 is performed by the first and second comparators $54_1$ and $54_2$. Namely, as long as the operation of the external photodiode EPD is proper and normal, i.e. as long as the output signal of the second comparator $54_2$ is maintained at the high level, the output terminal of the switching circuit 48 is connected to the output terminal of the second I/V converter $44_2$, as shown in FIG. 2. In this case, the feedback control of the output current of the electric current power source circuit 40 is performed in a high-speed mode, because the external photodiode EPD, which may formed as a PIN-type photodiode, is superior in ability of response to the internal photodiode IPD integrally assembled in the small substrate of the semiconductor laser device 18, as mentioned above, resulting in performance of printing operation at a high speed mode or usual mode) in the laser printer 10.

On the other hand, when the operation of the external photodiode EPD is improper and abnormal, i.e. when the output signal of the second comparator $54_2$ is changed from the high level to the low level, the connection of the output terminal of the switching circuit 48 to the second I/V converter $44_2$ is switched to the output terminal of the first I/V converter $44_1$. In this case, the feedback control of the output current of the electric current power source circuit 40 is performed in a low-speed mode, because the internal photodiode IPD is inferior in ability of response to the external photodiode EPD, resulting in performance of printing operation at a low speed mode or provisional mode in the laser printer 10.

As shown in FIG. 2, the modulation circuit 42 includes a digital-to-analog converter 56 for converting either a usual digital white-level data or a provisional digital white-level data into an analog white-level voltage VW, and a digital-to-analog converter 58 for converting either a usual digital black-level data or a provisional digital black-level data into an analog black-level voltage VB. These digital white-level and black-level data are previously stored in the ROM 12B of the printer controller 12.

The usual and provisional digital white-level data are selectively outputted from the printer controller 12 to the D/A converter 56, and the usual and provisional digital black-level data are selectively outputted from the printer controller 12 to the D/A converter 58. Namely, as mentioned hereinafter, when the printing operation is performed in the high-speed mode or usual mode, the usual digital white-level data and the usual digital black-level data are outputted to the D/A converters 56 and 58, respectively, and, when the printing operation is performed in the low-speed mode or provisional mode, the provisional digital white-level data and the provisional digital black-level data are outputted to the D/A converters 56 and 58, respectively.

Figure 3:
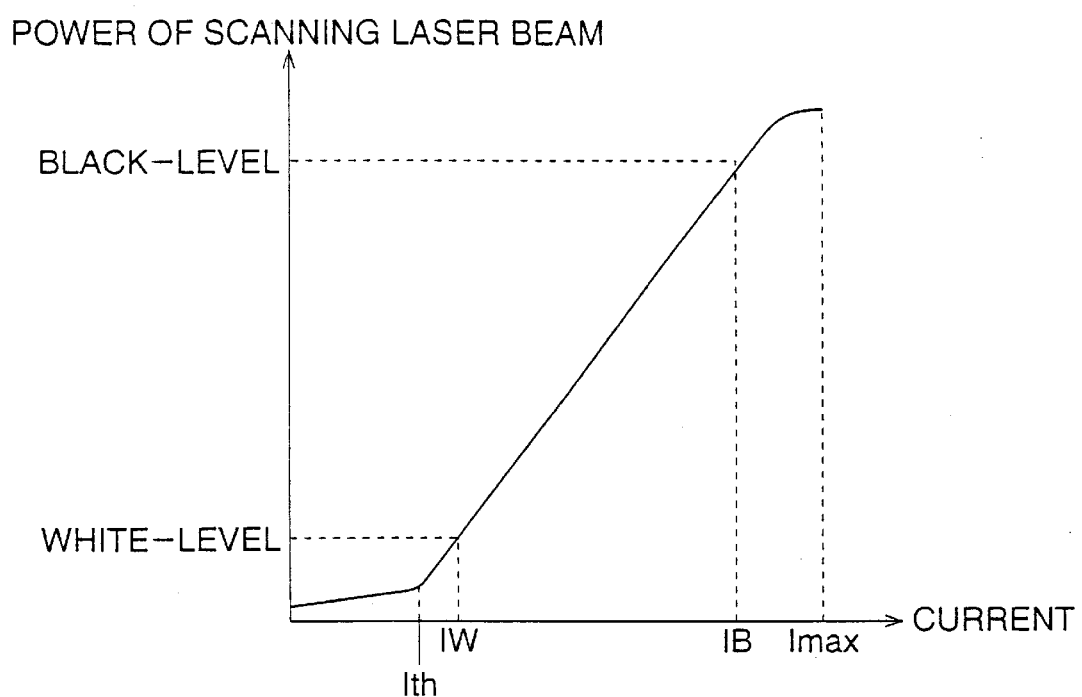
FIG. 3 is a graph of a relationship between a power of an scanning laser beam and an output current of an electric current power source for a laser diode of the semiconductor laser device.

The usual and provisional digital white-level data and the usual and provisional digital black-data are previously determined on the basis of a current/power characteristic of the laser diode LD, as shown in a graph of FIG. 3, and a scanning speed of the scanning laser beam LB1, and therefore, a rotating speed of the polygon mirror 26.

In particular, the power of the scanning laser beam LB1 emitted from the laser diode LD is increased as the electric current, with which the laser diode LD is electrically energized, becomes larger. As is apparent from the graph of FIG. 3, the increase of the power of the scanning laser beam LB1 is slack until the electric current reaches a certain threshold current $I_{th}$; then the increase of the power of the scanning laser beam LB1 is sudden and linear after the electric current exceeds the threshold current $I_{th}$; and the increase of the scanning laser beam LB1 is saturated when the electric current reaches the maximum current $I_{MAX}$. Each of the usual and provisional digital white-level data is determined such that a power of the scanning laser beam LB1 is a white-level corresponding to a white-level current IW, which is set on the basis of the scanning speed of the scanning laser beam, and which is larger than the threshold current $I_{th}$. Also, each of the usual and provisional digital black-level data is determined such that a power of the scanning laser beam LB1 is a black level corresponding to a black-level current IB, which is set on the basis of the scanning speed of the scanning laser beam, and which is smaller than the maximum current $I_{MAX}$. Note, of course, the aforementioned power range, within which the power of the scanning laser beam LB1 is variable, corresponds to the linear range defined between the white-level current IW and the black-level current IB.

As shown in FIG. 2, the modulation circuit 42 also includes a digital-to-analog converter 60 for converting a digital pixel-image signal, read from the frame memory 12E, into a voltage VM, which is modulated in accordance with 10-bit gradation data representing the digital pixel-signal concerned. The black-level voltage VB, outputted from the D/A converter 58, is inputted to the D/A converter 60 as a reference voltage, and a level of the modulated voltage VM is determined on the basis of the black-level voltage VB. Note, of course, the level of the modulated voltage VM corresponds to one of the aforementioned gradations of 1024 levels.

The modulation circuit 42 further includes an adder circuit 61, in which the modulated voltage VM, outputted from the D/A converter 60, is added to the white-level voltage VW outputted from the D/A converter 56, and the resultant voltage is outputted as the aforementioned reference voltage $V_{ref}$ to the APC circuit 38. In short, the reference voltage $V_{ref}$ represents the density or gradation-level of the digital image-pixel signal concerned, and the power of the scanning laser beam LB1 is varied and modulated on the basis of the reference voltage $V_{ref}$ in the aforementioned manner.

As is apparent from FIG. 2, the output terminals of the first and second comparators $54_1$ and $54_2$ are connected to the CPU 12A of the printer controller 12, and the output signals of the comparators $54_1$ and $54_2$ are retrieved by the CPU 12A. When the output signal of the first comparator $54_1$ is maintained at the high level, i.e. when the output voltage V1 of first I/V converter $44_1$ is higher than the divided voltage V2D, it is determined by the CPU 12A that the internal photodiode IPD is properly and normally operated. Also, when the output signal of the second comparator $54_2$ is maintained at the high level, i.e. when the output voltage V2 of second I/V converter $44_2$ is higher than the divided voltage V1D, it is determined by the CPU 12A that the external photodiode EPD is properly and normally operated.

As shown in FIG. 2, the laser printer 10 is provided with a first light emitting diode (LED) 62 for indicating whether the internal photodiode IPD is properly and normally operated, and a second light emitting diode (LED) 64 for indicating whether the external photodiode EPD is properly and normally operated. The first LED 62 is usually switched OFF, but the first LED 62 is lit as soon as it is detected that the operation of the internal photodiode IPD is improper and abnormal. Similarly, the second LED 64 is usually switched OFF, but the second LED 64 is lit as soon as it is detected that the operation of the external photodiode EPD is improper and abnormal.

The first and second LED's 62 and 64 are arranged on a suitable area of a housing (not shown) of the laser printer 10, and the lighting of each LED (62, 64) is controlled by the CPU 12A of the printer controller 12. Note, the CPU 12A contains power source circuits for electrically energizing the first and second LED's 62 and 64, respectively.

Although not shown in FIG. 2, the scanner driver circuit 36 is provided with a driver circuit for driving an electric motor, by which the polygon mirror 26 is rotated. The driver circuit is operated under control of the printer controller 12. Namely, the polygon mirror 26 is rotated at a usual speed or high speed when the printing operation is performed in the usual mode, and the polygon mirror 26 is rotated at a provisional speed or low speed when the printing operation is performed in the provisional mode.

Figure 4:
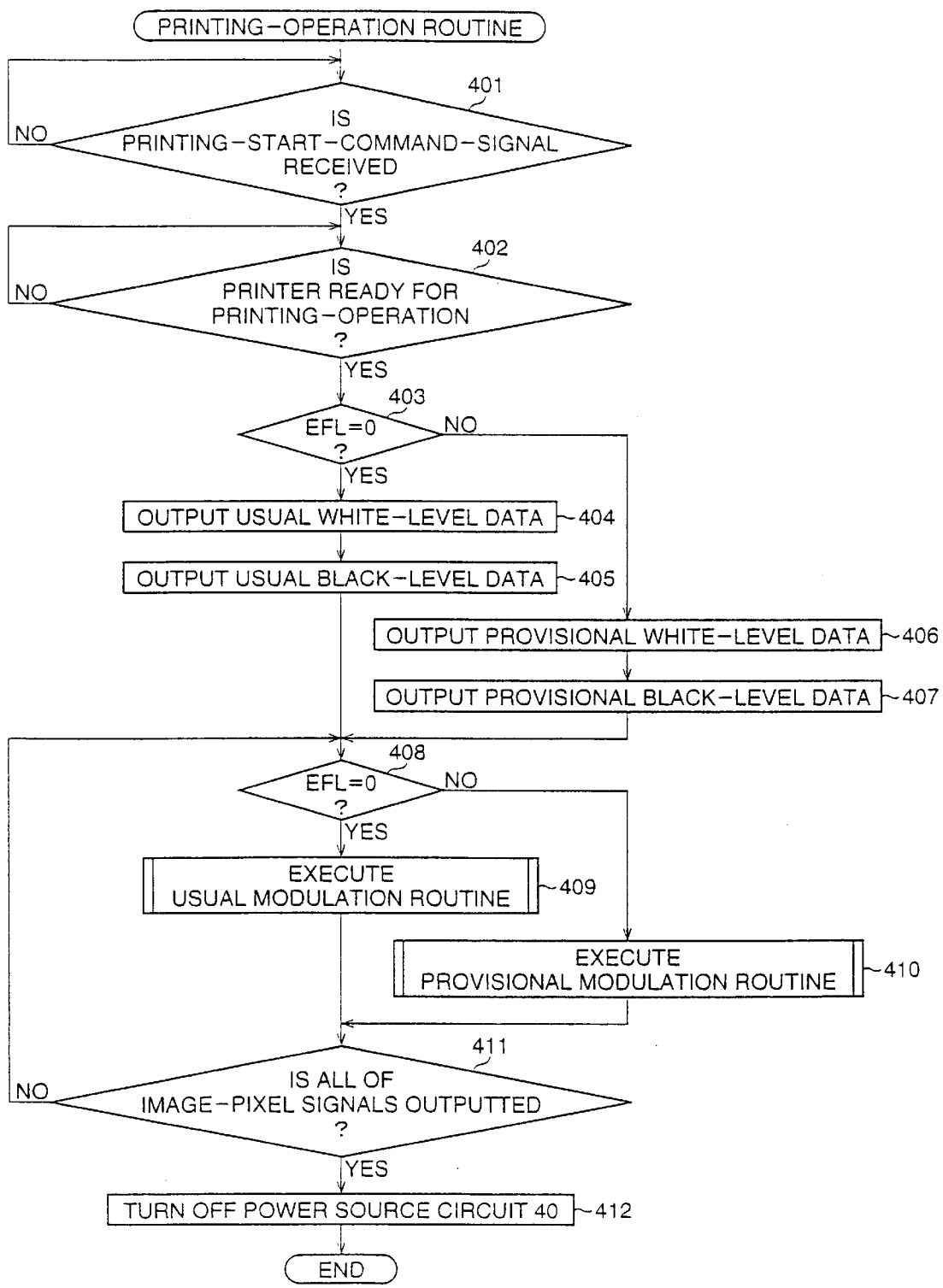
FIG. 4 is a flowchart of a printing-operation routine executed in the printer controller.

FIG. 4 shows a flowchart of a printing operation routine executed in the CPU of 12A of the printer controller 12.

At step 401, it is determined whether a printing-start-command-signal is received from a host controller of a personal computer or word processor which is connected the laser printer 10. When the receipt of the printing-start-command-signal from the host controller is confirmed, the control proceeds to step 402, in which it is determined whether the laser printer 10 is ready for a printing operation. When it is confirmed that the laser printer 10 is at the ready, the control proceeds to step 403.

At step 403, it is determined whether a flag EFL is "0" or "1". The flag EFL is used to indicate whether the external photodiode EPD is properly and normally operated. Namely, if EFL=0, it indicates that the operation of the external photodiode EPD is proper and normal, and, if EFL=1, it indicated that the operation of the external photodiode EPD is improper and abnormal.

Note, the flag EFL is initialized to "0" when a power switch (not shown) is turned ON. However, whenever it is detected that the operation of the external photodiode EPD is improper and abnormal, i.e. whenever the output signal of the second comparator $54_2$ is changed from the high level into the low level, the flag EFL is made to be "1".

At step 403, if EFL=0, the control proceeds to step 404, in which the usual digital white-level data is outputted from the printer controller 12 to the D/A converter 56. Then, at step 405, the usual digital black-level data is outputted from the printer controller 12 to the D/A converter 58.

On the other hand, at step 403, if EFL=1, the control proceeds from step 403 to step 406, in which the provisional digital white-level data is outputted from the printer controller 12 to the D/A converter 56, and is converted into an analog white-level voltage VW, which is inputted to and set in the adder circuit 61. Then, at step 407, the provisional digital black-level data is outputted from the printer controller 12 to the D/A converter 58, and is converted into an analog black-level voltage VB, which is inputted to and set in the D/A converter 60.

At step 408, it is again determined whether the flag EFL is again "0" or "1". If EFL=0, the control proceeds to step 409, in which a usual moderation routine (FIG. 5) is executed. Namely, in this case, the printing operation is performed in the usual mode or high-speed mode by repeatedly executing the usual moderation routine, as explained with reference to FIG. 5.

At step 408, if EFL=1, the control proceeds to step 410, in which a provisional moderation routine (FIG. 6) is executed. Namely, in this case, the printing operation is performed in the provisional mode or low-speed mode by repeatedly executing the provisional moderation routine, as explained with reference to FIG. 6.

At step 411, it is determined whether all of the image-pixel signals are outputted from the personal computer or word processor. When the outputting of all of the image-pixel signals is not still completed, the control returns to step 408, and either the usual modulation routine (step 409) or the provisional modulation routine (step 410) is repeatedly executed until the outputting of all of the image-pixel signals is completed.

At step 411, when it is confirmed that the outputting of all of the image-pixel signals has been completed, the control proceeds to step 412, in which the power source circuit 40 is turned OFF. Thus, the routine ends.

Figure 5:
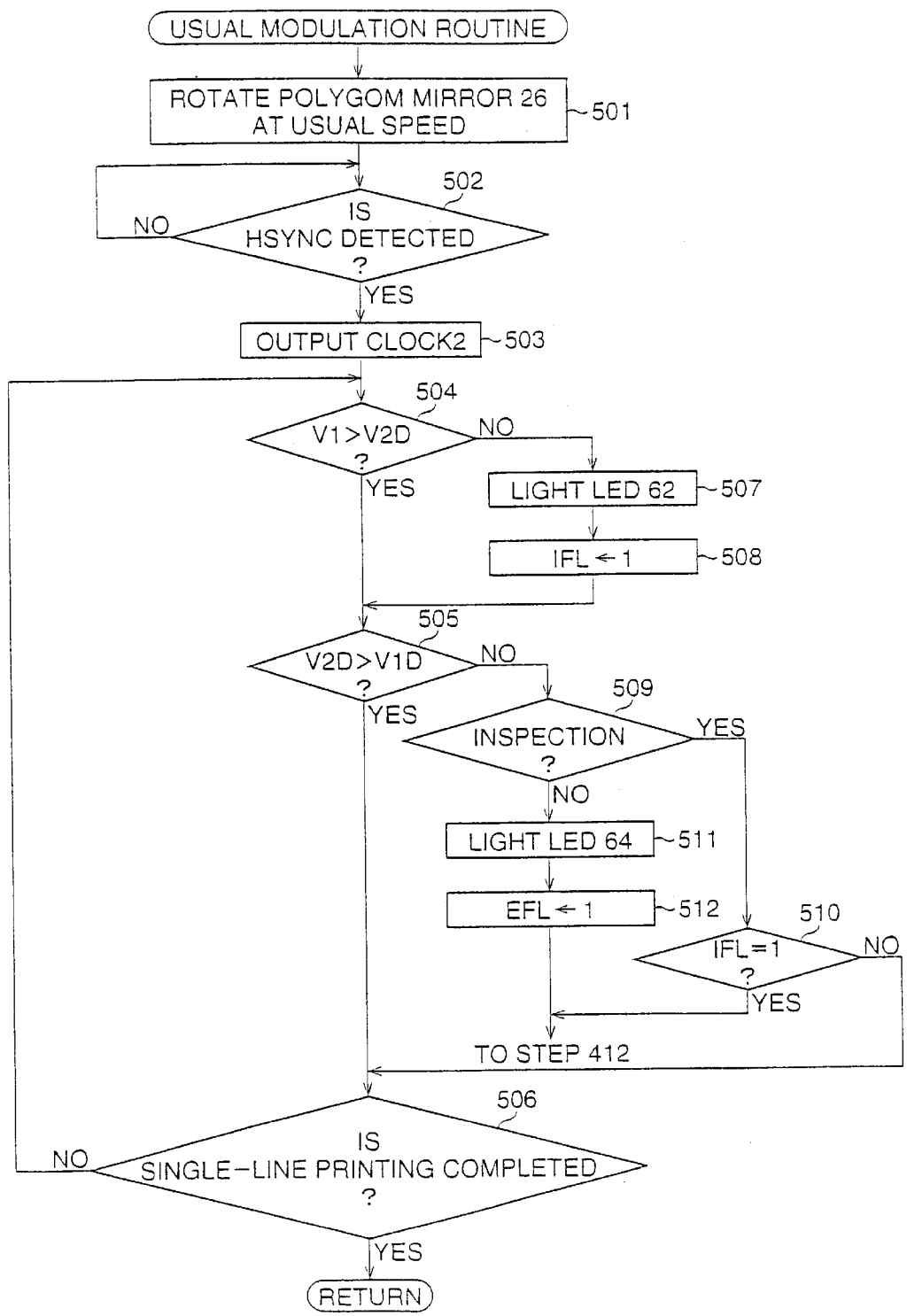
FIG. 5 is a flowchart of a usual modulation routine executed as a subroutine in the printing-operation routine of FIG. 4.

FIG. 5 shows a flowchart of the usual modulation routine executed in step 409 of the printing operation routine of FIG. 4.

At step 501, the polygon mirror 26 is rotated at the usual speed or high speed, and, at step 502, it is determined whether the horizontal synchronizing signal HSYNC is detected from the photo detector 32. When the detection of the signal HSYNC is confirmed, the control proceeds to step 503, in which the second series of clock pulses CLK2 is outputted from the clock pulse generator 12E to the frame memory 12D, whereby digital image-pixel signals included in a single line are successively read from the frame memory 12D in accordance with the second series of clock pulses CLK2, and are then fed to the D/A convertor 60. At the same time, the second series of clock pulses CLK2 is outputted from the clock pulse generator 12E to the D/A convertor 60, and the read digital image-pixel signals are successively processed by the D/A converter 60 in accordance with the second series of clock pulses CLK2.

Namely, as mentioned above, each of the read digital image-pixel signals is converted into a voltage VM, modulated in accordance with 10-bit gradation data representing the digital pixel-signal concerned, and then the modulated voltage VM is inputted to the adder circuit 61, in which the modulated voltage VM is added to the white-level voltage VW, and the resultant voltage or reference voltage $V_{ref}$ is outputted to the APC circuit 38, whereby the power of the scanning laser beam LB1 is controlled in the aforementioned manner.

At step 504, it is determined whether an output voltage V1 of the first I/V converter $44_1$, which represents the output current of the internal photodiode IPD, is higher than the divided voltage V2D derived from the output current of the external photodiode EPD. If V1>V2D, i.e. if the internal photodiode IPD is properly and normally operated, the control proceeds to step 505, in which it is determined whether the output voltage V2 of the second I/V converter $44_2$, which represents the output current of the external photodiode EPD, is higher than a divided voltage V1D derived from the output current of the internal photodiode IPD. If V2D>V1D, i.e. if the external photodiode EPD is properly and normally operated, the control proceeds to step 506, in which it is determined whether the printing operation based on the single-line of image-pixel signals is completed.

When the printing operation based on the single-line of image-pixel signals is not still completed, the control returns to step 504. Namely, as long as both the internal and external photodiodes IPD and EPD are properly and normally operated, the routine comprising steps 504, 505 and 506 is repeated until the printing operation based on the single-line of image-pixel is completed. At step 506, when it is confirmed that the printing operation based on the single-line of image-pixel is completed, the control returns to step 412 of the printing-operation routine of FIG. 4.

At step 504, if V1<V2D, i.e. if it is detected that the operation of the internal photodiode IPD is improper and abnormal, the control proceeds from step 504 to step 507, in which the first LED 62 is lit. Then, at step 508, a flag IFL is made to be "1". Namely, the flag IFL indicated whether the internal photodiode IPD is properly and normally operated. In short, if IFL=0, it indicates that the operation of the internal photodiode IPD is proper and normal, and, if IFL=1, if indicates that the operation of the internal photodiode IPD is improper and abnormal.

Note, similar to the flag EFL, the flag IFL is also initialized to "0" when the power switch (not shown) of the laser printer 10 is turned ON. However, whenever it is detected that the operation of the internal photodiode IPD is improper and abnormal, i.e. whenever the output signal of the first comparator $54_1$ is changed from the high level into the low level, the flag IFL is made to be "1".

Even if the operation of the internal photodiode IPD is improper and abnormal, the APC circuit 38 can properly and normally operate on the basis of the output current of the external photodiode EPD. Thus, after the flag IFL is made to be "1" in step 508, the control proceeds to step 505, whereby the printing operation is continued in the usual mode or high-speed mode. Of course, when the operation of the internal photodiode IPD is improper and abnormal, it is impossible to detect whether the external photodiode EPD is properly and normally operated. Thus, the LED 62 is lit to indicate that the semiconductor laser device 18 should be exchanged with a fresh one (step 507).

At step 505, if V2D<V1D, i.e. if it is detected that the operation of the external photodiode EPD is improper and abnormal, the control proceeds from step 505 to step 509, in which it is determined whether the laser printer 10 is being inspected. The inspection of the printer 10 is performed by connecting the CPU 12A of the printer controller 12 to an external inspection computer (not shown). Accordingly, the CPU 12A can confirm the performance of the inspection of the laser printer 10 by detecting the connection of the CPU 12A to the external inspection computer. Note, of course, if V2D<V1D, the connection of the output terminal of the switching circuit 48 to the output terminal of the second I/V converter $44_2$ is switched to the output terminal of the first I/V converter $44_1$, as already mentioned above.

If the performance of the inspection of the laser printer 10 is confirmed, the control proceeds from step 509 to step 510, in which it is determined whether the flag IFL is "1" or "0". If IFL=0, i.e. if the internal photodiode IPD is properly and normally operated, the control proceeds from step 510 to 506, and thus the printing operation is continued.

During the inspection of the laser printer 10, from which a cover or housing is removed, the laser beam LB2 to be detected by the external photodiode EPD may be accidently blocked off by a tool, such as a screw driver, foreign matters or the like. Of course, when the laser beam LB2 is blocked off (V2D<V1D), it is detected that the operation of the external photodiode EPD is improper and abnormal.

Nevertheless, the output current of the electric current power source 40 for electrically energizing the laser diode LD cannot be abruptly and excessively increased as long as the operation of the internal photodiode IPD is proper and normal, because the connection of the output terminal of the switching circuit 48 to the second I/V converter $44_2$ is switched to the output terminal of the first I/V converter $44_1$, whereby the APC circuit 38 can operate on the basis of the output current of the internal photodiode IPD.

At step 510, if IFL=1, i.e. if the operation of the internal photodiode IPD is improper and abnormal, the control returns to step 412 of the printing operation routine of FIG. 4, in which the power source circuit 40 is turned OFF, i.e. the printing operation is immediately stopped.

At step 509, if the performance of the inspection of the laser printer 10 is not confirmed, the control proceeds from step 509 to step 511, in which the second LED 64 is lit. Then, at step 512, the flag EFL is made to be "1". Thereafter, the control returns to step 412 of the printing operation routine of FIG. 4, in which the power source circuit 40 is turned OFF, i.e. the printing operation in the usual mode or high-speed mode is stopped.

When the operation of the external photodiode EPD is improper and abnormal, the performance of the printing operation in the usual mode or high-speed mode is impossible. Nevertheless, it is possible to provisionally perform the printing operation in the low-speed mode by operating the APC circuit 39 on the basis of the output current of the internal photodiode IPE.

Figure 6:
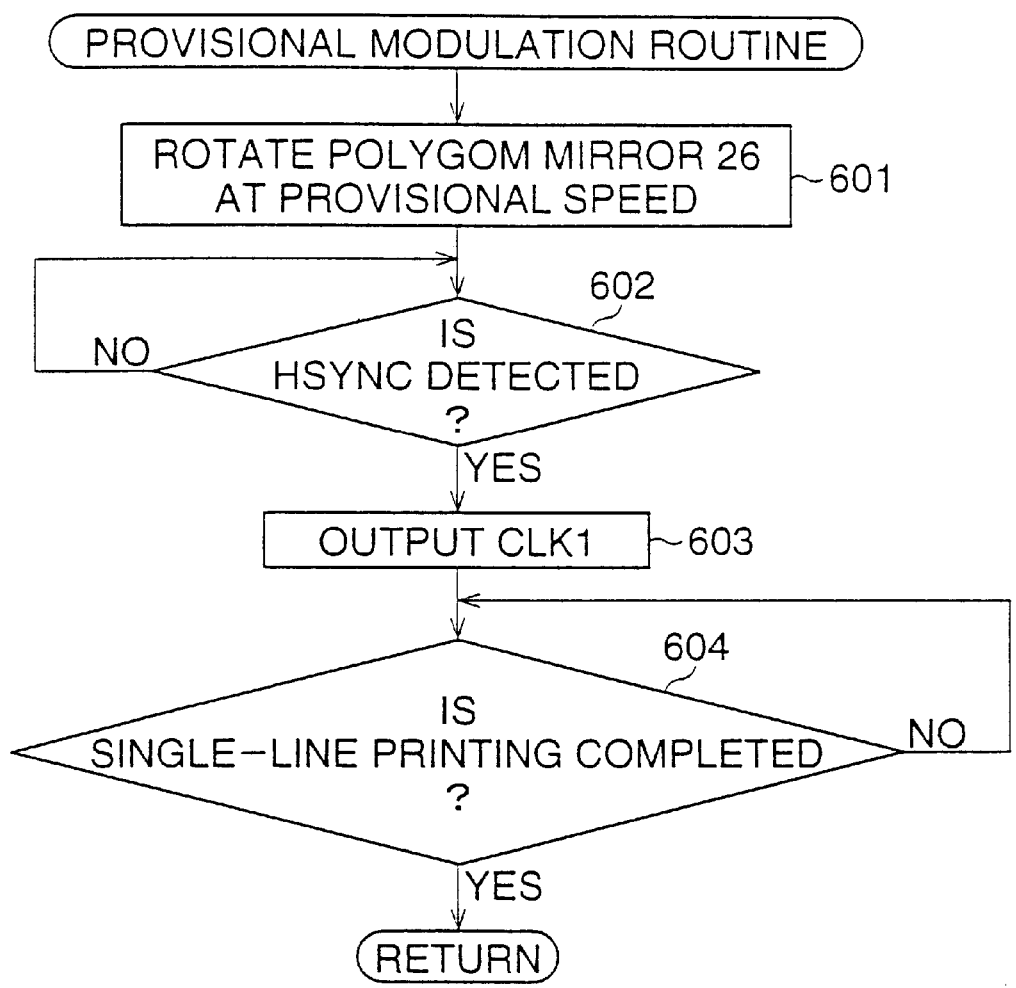
FIG. 6 is a flowchart of a low-speed modulation routine executed as a subroutine in the printing-operation routine of FIG. 4.

FIG. 6 shows a flowchart of the provisional modulation routine which is executed in step 410 of FIG. 4 when the printing operation is provisionally performed in low-speed mode.

At step 601, the polygon mirror 26 is rotated at the provisional speed or low speed, and, at step 602, it is determined whether the horizontal synchronizing signal HSYNC is detected from the photo detector 32. When the detection of the signal HSYNC is confirmed, the control proceeds to step 603, in which the first series of clock pulses CLK1, which has a lower frequency than that of the second series of clock pulses CLK2, is outputted from the clock pulse generator 12E to the frame memory 12D, whereby digital image-pixel signals included in a single line are successively read from the frame memory 12D in accordance with the first series of clock pulses CLK1, and then the read digital image-pixel signals are fed to the D/A convertor 60. At the same time, the first series of clock pulses CLK1 is outputted from the clock pulse generator 12E to the D/A convertor 60, and the read digital image-pixel signals are successively processed by the D/A converter 60 in accordance with the first series of clock pulses CLK1.

At step 604, it is determined whether the printing operation based on the single-line of image pixel signals is completed. When it is confirmed that the printing operation based on the single-line of image-pixels is completed, the control returns to step 411 of the printing-operation routine of FIG. 4.

Figure 7:
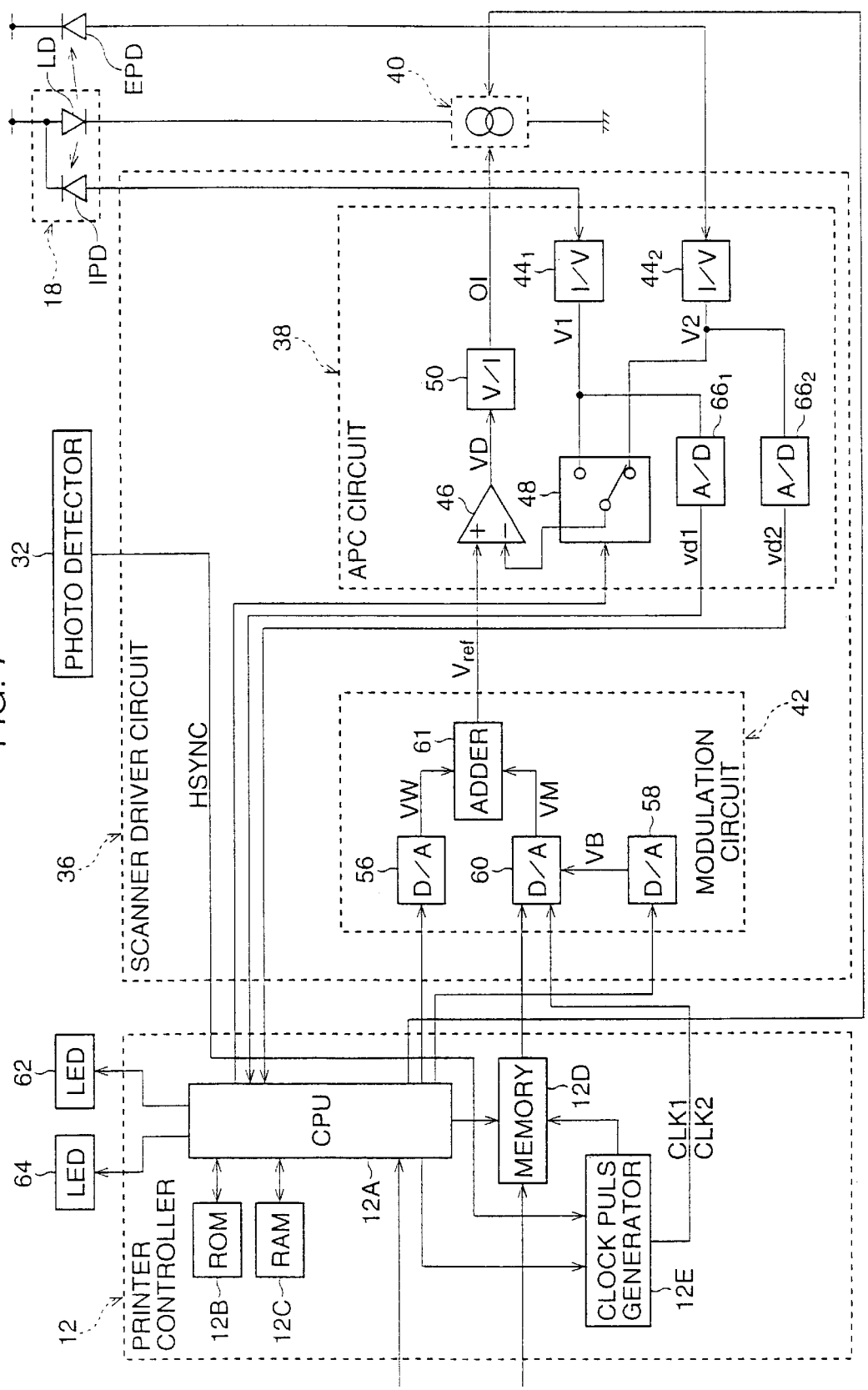
FIG. 7 is a schematic block diagram showing a modification of the embodiment of the power controller shown in FIG. 2.

FIG. 7 shows a modification of the embodiment of the power controller shown in FIG. 2. Note, in FIG. 7, the features similar to those of FIG. 2 are indicated by the same references. The modified power controller is identical to the power controller of FIG. 2 except that the APC circuit 38 is provided with a set of first and second analog-to-digital (A/D) converters $66_1$ and $66_2$ which are substituted for the set of first and second variable resistances $52_1$ and $52_2$ and the set of first and second comparators $54_1$ and $54_2$.

As shown in FIG. 7, the first A/D converter $66_1$ converts the output voltage V1 of the first I/V converter $44_1$ into a digital voltage data vd1, and the second A/D converter $66_2$ converts the output voltage V2 of the first I/V converter $44_2$ into a digital voltage data vd2. The digital voltage data vd1 and vd2 are retrieved by the CPU 12A of the printer controller 12, and are utilized to determine whether the internal and external photodiodes IPD and EPD are properly and normally operated. Also, the digital voltage data vd1 and vd2 are utilized to control a switching operation of the switching circuit 48.

In the laser printer having the modified power controller of FIG. 7, a printing operation may be performed in accordance with the printing operation routine as shown in FIG. 4, except that another usual modulation routine is executed in step 409 of FIG. 4, and that another provisional modulation routine is executed in step 410 of FIG. 4.

Figure 8:
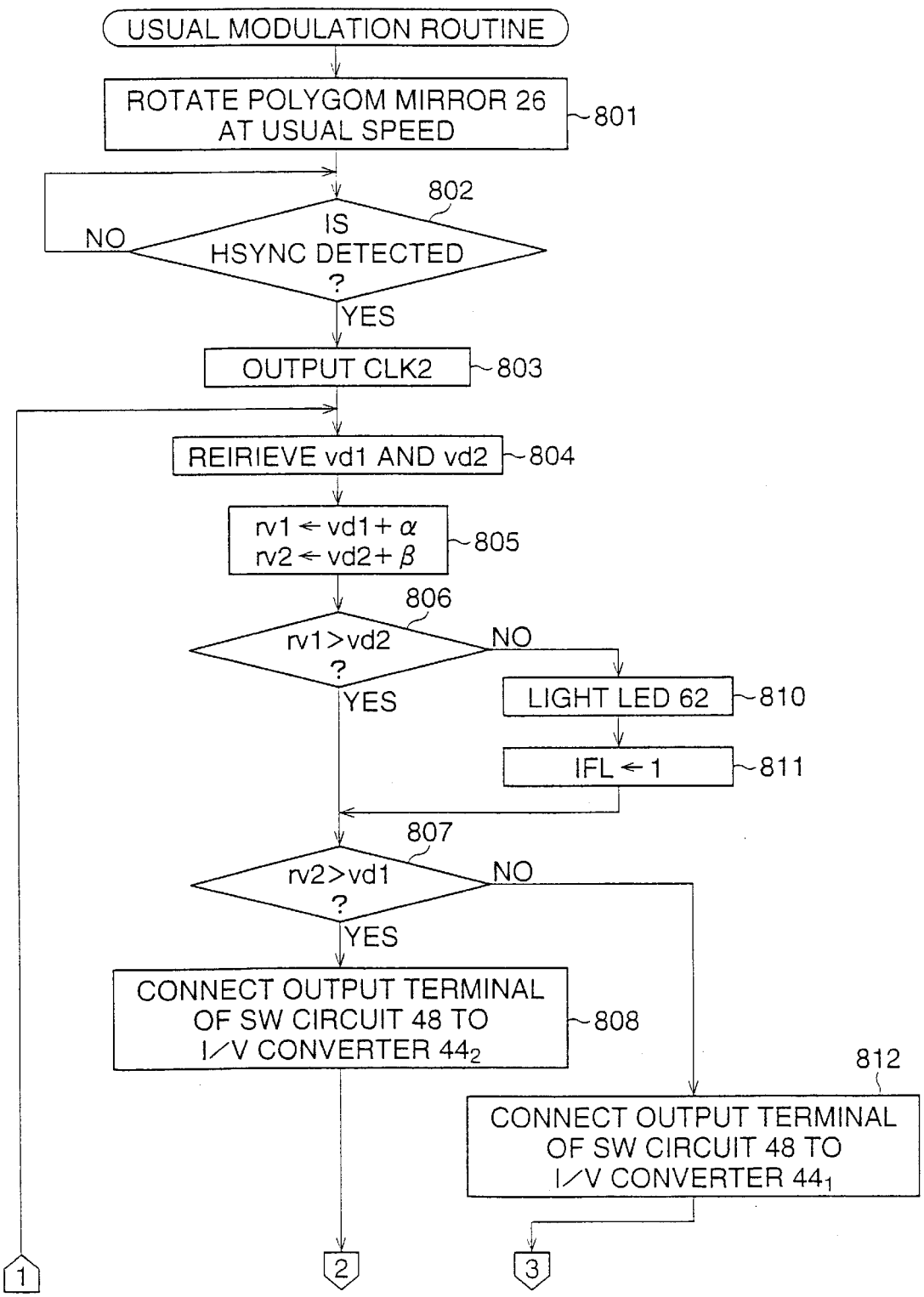
FIG. 8 is a part of a flowchart of a usual modulation routine executed in the modified embodiment of the power controller shown in FIG. 7.
Figure 9:
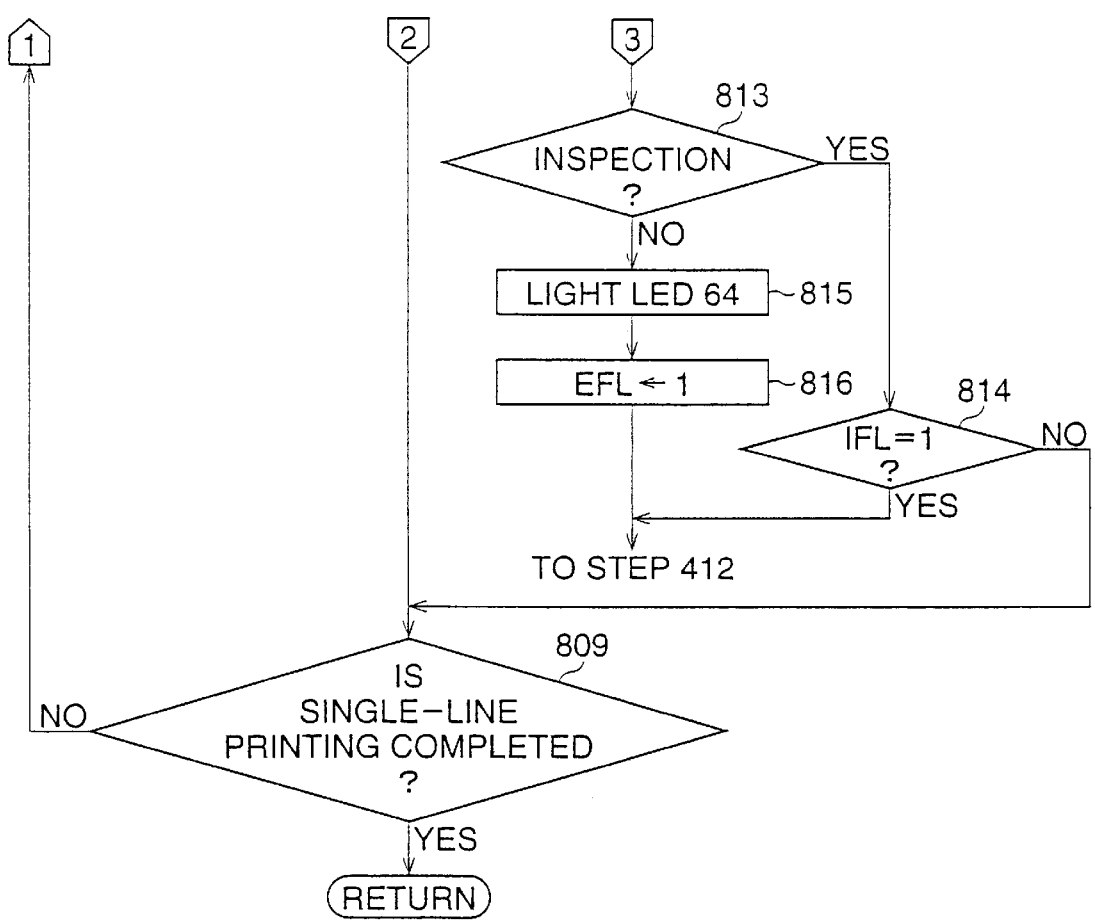
FIG. 9 is the remaining part of the flowchart of the usual modulation routine executed in the modified embodiment of the power controller shown in FIG. 7.

FIGS. 8 and 9 show a flowchart of the other usual modulation routine executed in step 409 of FIG. 4.

At step 801, the polygon mirror 26 is rotated at the usual speed or high speed, and, at step 802, it is determined whether the horizontal synchronizing signal HSYNC is detected from the photo detector 32. When the detection of the signal HSYNC is confirmed, the control proceeds to step 803, in which the second series of clock pulses CLK2 is outputted from the clock pulse generator 12E to the frame memory 12D, whereby digital image-pixel signals included in a single line are successively read from the frame memory 12D in accordance with the second series of clock pulses CLK2, and then the read digital image-pixel signals are processed by the D/A convertor 60 in substantially the same manner as mentioned above.

At step 804, the digital voltage data vd1 and vd2 are retrieved from the first and second A/D converters $66_1$ and $66_2$, and, at step 805, the following calculations are executed:

$$rv1 - vd1 + \alpha$$

$$rv2 - vd2 + \beta$$

Herein: "$\alpha$" and "$\beta$" represent a suitable margin voltage data, which are previously selected and stored in the ROM 12B of the printer controller 12.

At step 806, it is determined whether the resultant voltage data rv1 is higher than the voltage data vd2. If rv1>vd2, i.e. if the internal photodiode IPD is properly and normally operated, the control proceeds to step 807, in which it is determined whether the resultant voltage data rv2 is higher than the voltage data vd1.

If rv2>vd1, i.e. if the external photodiode EPD is properly and normally operated, the control proceeds to step 808, in which the output terminal of the switching circuit 48 is connected to the second I/V converter $44_2$. Then, at step 809, it is determined whether the printing operation based on the single-line of image-pixel signals is completed.

When the printing operation based on the single-line of image-pixel signals is not still completed, the control returns to step 804. Namely, as long as both the internal and external photodiodes IPD and EPD are properly and normally operated, the routine comprising steps 804, 805, 806, 807, 808 and 809 is repeated until the printing operation based on the single-line of image-pixel is completed. At step 809, when it is confirmed that the printing operation based on the single-line of image-pixel is completed, the control returns to step 412 of the printing-operation routine of FIG. 4.

At step 806, if rv1<vd2, i.e. if it is detected that the operation of the internal photodiode IPD is improper and abnormal, the control proceeds from step 806 to step 810, in which the first LED 62 is lit. Then, at step 811, the flag IFL is made to be "1". Of course, the flag IFL is to indicate whether the internal photodiode IPD is properly and normally operated. In short, if IFL=0, it indicated that the operation of the internal photodiode IPD is proper and normal, and, if IFL=1, it indicates that the operation of the internal photodiode IPD is improper and abnormal.

As already mentioned above, the flag IFL is initialized to "0" when the power switch of the laser printer is turned ON. However, whenever it is detected that the operation of the internal photodiode IPD is improper and abnormal, i.e. whenever the output signal of the first comparator $54_1$ is changed from the high level into the low level, the flag IFL is made to be "1".

Similar to the aforementioned case, even if the operation of the internal photodiode IPD is improper and abnormal, the APC circuit 38 can properly and normally operate on the basis of the output current of the external photodiode EPD. Thus, after the flag IFL is made to be "1" in step 811, the control proceeds to step 807, whereby the printing operation is continued in the usual mode or high-speed mode. Of course, when the operation of the internal photodiode IPD is improper and abnormal, it is impossible to detect whether the external photodiode EPD is properly and normally operated. Thus, the LED 62 is lit to indicate that the semiconductor laser device 18 should be exchanged with a fresh one (step 810).

At step 807, if rv2<vd1, i.e. if it is detected that the operation of the external photodiode EPD is improper and abnormal, the control proceeds from step 807 to step 812, in which the output terminal of the switching circuit 48 is connected to the first I/V converter $44_1$. Then, at step 813, it is determined whether the laser printer 10 is being inspected. Similar to the aforementioned case, the CPU 12A can confirm the performance of the inspection of the laser printer by detecting the connection of the CPU 12A to the external inspection computer.

If the performance of the inspection of the laser printer is confirmed, the control proceeds from step 813 to step 814, in which it is determined whether the flag IFL is "1" or "0". If IFL=0, i.e. if the internal photodiode IPD is properly and normally operated, the control proceeds from step 814 to 809, and thus the printing operation is continued.

Similar to the aforementioned case, during the inspection of the laser printer, from which a cover or housing is removed, the laser beam LB2 to be detected by the external photodiode EPD may be accidently blocked off by a tool, such as a screw driver, foreign matter or the like. Of course, when the laser beam LB2 is blocked off (rv2<vd1), it is detected that the operation of the external photodiode EPD is improper and abnormal. Nevertheless, the output current of the electric current power source 40 for the laser diode LD cannot be abruptly and excessively increased as long as the operation of the internal photodiode IPD is proper and normal, because the connection of the output terminal of the switching circuit 48 to the second I/V converter $44_2$ is switched to the output terminal of the first I/V converter $44_1$ (step 812), whereby the APC circuit 38 can operate on the basis of the output current of the internal photodiode IPD.

At step 814, if IFL=1, i.e. if the operation of the internal photodiode IPD is improper and abnormal, the control returns to step 412 of the printing operation routine of FIG. 4, in which the power source circuit 40 is turned OFF, i.e. the printing operation is immediately stopped.

At step 813, if the performance of the inspection of the laser printer is not confirmed, the control proceeds from step 813 to step 815, in which the second LED 64 is lit. Then, at step 816, the flag EFL is made to be "1". Of course, the flag EFL is to indicate whether the external photodiode EPD is properly and normally operated. In short, if EFL=0, it indicated that the operation of the external photodiode EPD is proper and normal, and, if EFL=1, it indicates that the operation of the external photodiode EPD is improper and abnormal. Thereafter, the control returns to step 412 of the printing operation routine of FIG. 4, in which the power source circuit 40 is turned OFF, i.e. the printing operation in the usual mode or high-speed mode is stopped.

Similar to the aforementioned case, when the operation of the external photodiode EPD is improper and abnormal, the performance of the printing operation in the usual mode or high-speed mode is impossible. Nevertheless, it is possible to provisionally perform the printing operation in the low-speed mode by operating the APC circuit 39 on the basis of the output current of the internal photodiode IPE.

Figure 10:
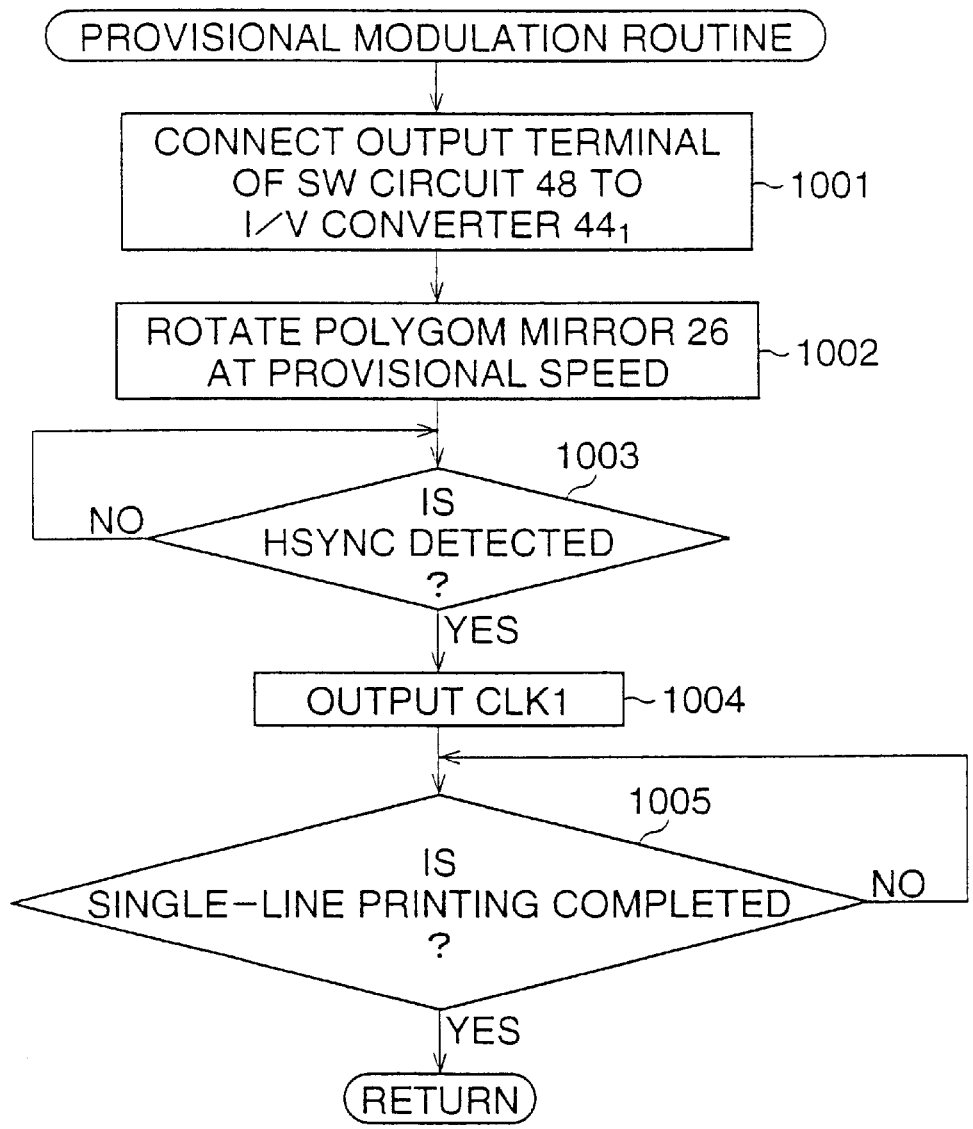
FIG. 10 is a flowchart of a low-speed modulation routine executed in the modified embodiment of the power controller shown in FIG. 7.

FIG. 10 shows a flowchart of the other provisional modulation routine executed in step 409 of FIG. 4 when the laser printer has the modified power controller of FIG. 7.

In the provisional modulation routine of FIG. 10, respective steps 1002 to 1004 correspond to steps 601 to 604 of FIG. 6. Namely, the provisional modulation routine of FIG. 10 is substantially identical to that of FIG. 6 except that step 1001, in which the output terminal of the switching circuit 48 is connected to the first I/V converter 44₁, is added. In short, the APC circuit 39 operates on the basis of the output current of the internal photodiode IPE, and thus the printing operation is provisionally performed in the low-speed mode.

Finally, it will be understood by those skilled in the art that the foregoing description is of preferred embodiments of the semiconductor laser power controller, and that various changes and modifications may be made to the present invention without departing from the spirit and scope thereof.

The present disclosure relates to subject matter contained in Japanese Patent Application No. 11-007673 (filed on Jan. 14, 1999), which is expressly incorporated herein, by reference, in its entirety.

What is claimed is:

1. A power controller for a semiconductor laser device including a laser diode and an internal photodiode integrally assembled in a small substrate, which comprises:

an electric current power source that electrically energizes said laser diode, an output power of said laser diode being detected as a first electric current detection signal by said internal photodiode;

an external photodiode that detects an output power of said laser diode as a second electric current detection signal;

a feedback controller that controls said electric current power source on the basis of one of said first and second electric current detection signals; and a determiner that determines whether an operation of said external photodiode is proper and normal, wherein the controlling of said electric current power source by said feedback controller is based on said second electric current detection signal when it is determined by said determiner that the operation of said external photodiode is proper and normal, and wherein the controlling of said electric current power source by said feedback controller is based on said first electric current detection signal when it is determined by said determiner that the operation of said external photodiode is improper and abnormal.

2. A laser printer having the power controller as set forth in claim 1, which comprises:

a laser beam scanner that deflects a laser beam, obtained by said laser diode, to produce a scanning laser beam; and a modulator that modulates a power of said scanning laser beam by controlling said power controller in accordance with gradation data representing a digital image-pixel signal, wherein the modulation of the power of said scanning laser beam is performed in a low-speed mode when the controlling of said electric current power source by said feedback controller is based on said first electric current detection signal, and wherein the modulation of the power of said scanning laser beam is performed in a high-speed mode when the controlling of said electric current power source by said feedback controller is based on said second electric current detection signal.

3. A power controller for a semiconductor laser device including a laser diode and an internal photodiode integrally assembled in a small substrate, which comprises:

an electric current power source that electrically energizes said laser diode, a output power of said laser diode being detected as a first electric current detection signal by said internal photodiode;

an external photodiode that detects an output power of said laser diode as a second electric current detection signal;

a feedback controller that controls said electric current power source on the basis of one of said first and second electric current detection signals;

a first determiner that determines whether an operation of said internal photodiode is proper and normal; and a second determiner that determines whether an operation of said external photodiode is proper and normal, wherein the controlling of said electric current power source by said feedback controller is based on said second electric current detection signal when it is determined by said second determiner that the operation of said external photodiode is proper and normal, and wherein the controlling of said electric current power source by said feedback controller is based on said first electric current detection signal when it is determined by said second determiner that the operation of said external photodiode is improper and abnormal and when it is determined by said first determiner that the operation of said internal photodiode is proper and normal.

4. A power controller as set forth in claim 3, wherein the determination of said first determiner is based on a comparison of said first electric current detection signal, obtained from said internal photodiode, with said second electric current detection signal obtained from said external photodiode, and the determination of said second determiner is based on a comparison of said second electric current detection signal, obtained from said external photodiode, with said first electric current detection signal obtained from said internal photodiode.

5. A power controller as set forth in claim 4, further comprising:

a first current-to-voltage converter that converts said first electric current detection signal into a first electric voltage signal;

a second current-to-voltage converter that converts said second electric current detection signal into a second electric voltage signal;

a switcher that selectively feeds one of said first and second electric voltage signals to said feedback controller for the controlling of said electric current power source by said feedback controller; and a switching controller that controls said switcher such that said second electric voltage signal is fed to said feedback controller when it is determined by said second determiner that the operation of said external photodiode is proper and normal, and such that said first electric voltage signal is fed to said feedback controller when it is determined by said second determiner that the operation of said external photodiode is improper and abnormal.

6. A power controller as set forth in claim 5, wherein said first determiner includes a first signal processor that processes said first electric voltage signal to produce a first derivative voltage signal representing said first electric current detection signal; and wherein said second determiner includes a second signal processor that processes said second electric voltage signal to produce a second derivative voltage signal representing said second electric current detection signal, the determination of said first determiner being based on a comparison of said first electric voltage signal with said second derivative voltage signal, and the determination of said second determiner being based on a comparison of said second derivative voltage signal with said first derivative voltage signal.

7. A power controller as set forth in claim 6, wherein said first signal processor includes
- a first current-to-voltage converter that converts said first electric current detection signal into said first electric voltage signal, and
- a first electric variable resistance that produces said first derivative voltage signal derived and divided from said first electric voltage signal; and wherein said second signal processor includes
- a second current-to-voltage converter that converts said second electric current detection signal into said second electric voltage signal, and
- a second electric variable resistance that produces said second derivative voltage signal derived and divided from said second electric voltage signal, said first signal processor further including a first comparator that compares said first voltage signal with said second derivative voltage signal, and said second signal processor further including a second comparator that compares said second derivative voltage signal with said first derivative voltage signal.

8. A power controller as set forth in claim 4, wherein said first determiner includes a first analog-to-digital converter that converts said first electric current detection signal into a first digital voltage signal, and a first adder that adds a first margin voltage data to said first digital voltage signal to produce a first resultant digital voltage signal; and wherein said second determiner includes a second analog-to-digital converter that converts said second electric current detection signal into a second digital voltage signal; and a second adder that adds a second margin voltage data to said second digital voltage signal to produce a second resultant digital voltage signal, said first determiner including a first comparator that compares said first resultant digital voltage signal with said second digital voltage signal, and said second determiner further including a second comparator that compares said second resultant digital voltage signal with said first digital voltage detection signal.

9. A power controller as set forth in claim 3, further comprising:

a first indicator that indicates whether the operation of said internal photodiode is proper and normal; and a second indicator that indicates whether the operation of said external photodiode is proper and normal.

10. A power controller as set forth in claim 9, wherein each of said first and second indicators comprises a visual indicator.

11. A power controller as set forth in claim 10, wherein said visual indicator is a light emitting diode.

* * * * *